United States Patent
Jones-Albertus et al.

(10) Patent No.: US 8,962,991 B2
(45) Date of Patent: Feb. 24, 2015

(54) PSEUDOMORPHIC WINDOW LAYER FOR MULTIJUNCTION SOLAR CELLS

(75) Inventors: Rebecca Elizabeth Jones-Albertus, Mountain View, CA (US); Ferran Suarez Arias, San Jose, CA (US); Michael West Wiemer, Campbell, CA (US); Michael J. Sheldon, San Jose, CA (US); Homan B. Yuen, Sunnyvale, CA (US)

(73) Assignee: Solar Junction Corporation, San Jose, CA (US)

( * ) Notice: Subject to any disclaimer, the term of this patent is extended or adjusted under 35 U.S.C. 154(b) by 8 days.

(21) Appl. No.: 13/370,500

(22) Filed: Feb. 10, 2012

(65) Prior Publication Data

US 2012/0216858 A1    Aug. 30, 2012

Related U.S. Application Data

(60) Provisional application No. 61/446,704, filed on Feb. 25, 2011.

(51) Int. Cl.
*H01L 31/04* (2014.01)
*H01L 31/0687* (2012.01)
*H01L 31/0304* (2006.01)

(52) U.S. Cl.
CPC ........ *H01L 31/0687* (2013.01); *H01L 31/0304* (2013.01); *H01L 31/06875* (2013.01); *Y02E 10/52* (2013.01); *Y02E 10/544* (2013.01)
USPC .......................................... 136/262; 136/246

(58) Field of Classification Search
CPC ................. H01L 31/0304–31/03048
USPC ................................. 136/243–265
See application file for complete search history.

(56) References Cited

U.S. PATENT DOCUMENTS

| 4,404,421 A | 9/1983 | Fraas |
| 4,881,979 A | 11/1989 | Lewis |

(Continued)

FOREIGN PATENT DOCUMENTS

| JP | 63100781 A | 5/1988 |
| JP | 06061513 | 3/1994 |

(Continued)

OTHER PUBLICATIONS

International Search Report and Written Opinion of the International Searching Authority for PCT Application No. PCT/US 12/25307, mailed on Aug. 16, 2012, 13 pages.

(Continued)

*Primary Examiner* — Bach Dinh
(74) *Attorney, Agent, or Firm* — Kilpatrick Townsend & Stockton LLP

(57) ABSTRACT

Photovoltaic cells with one or more subcells are provided with a wide band gap, pseudomorphic window layer of at least 15 nm in thickness and with an intrinsic material lattice constant that differs by at least 1% from an adjacent emitter layer. This window layer has a higher band gap than a window layer with substantially the same intrinsic material lattice constant as the adjacent emitter layer, which increases the light transmission through the window, thereby increasing the current generation in the solar cell. The quality of being pseudomorphic material preserves a good interface between the window and the emitter, reducing the minority carrier surface recombination velocity. A method is provided for building a wide band gap, pseudomorphic window layer of a photovoltaic cell that has an intrinsic material lattice constant that differs by at least 1% from the adjacent emitter layer.

20 Claims, 8 Drawing Sheets

(56) References Cited

U.S. PATENT DOCUMENTS

| | | | |
|---|---|---|---|
| 4,935,384 A * | 6/1990 | Wanlass | 438/94 |
| 5,009,719 A | 4/1991 | Yoshida | |
| 5,016,562 A | 5/1991 | Madan et al. | |
| 5,166,761 A | 11/1992 | Olson et al. | |
| 5,223,043 A | 6/1993 | Olson et al. | |
| 5,316,593 A | 5/1994 | Olson et al. | |
| 5,342,453 A | 8/1994 | Olson et al. | |
| 5,376,185 A | 12/1994 | Wanlass | |
| 5,405,453 A | 4/1995 | Ho et al. | |
| 5,689,123 A | 11/1997 | Major et al. | |
| 5,800,630 A | 9/1998 | Vilela et al. | |
| 5,911,839 A | 6/1999 | Tsai et al. | |
| 5,935,345 A | 8/1999 | Kuznicki | |
| 5,944,913 A | 8/1999 | Hou et al. | |
| 6,150,603 A | 11/2000 | Karam et al. | |
| 6,252,287 B1 | 6/2001 | Kurtz et al. | |
| 6,281,426 B1 | 8/2001 | Olson et al. | |
| 6,340,788 B1 | 1/2002 | King et al. | |
| 6,504,091 B2 | 1/2003 | Hisamatsu et al. | |
| 6,617,618 B2 | 9/2003 | Sato | |
| 6,660,928 B1 | 12/2003 | Patton et al. | |
| 6,756,325 B2 | 6/2004 | Bour et al. | |
| 6,764,926 B2 | 7/2004 | Takeuchi et al. | |
| 6,765,238 B2 | 7/2004 | Chang et al. | |
| 6,787,385 B2 | 9/2004 | Barber et al. | |
| 6,815,736 B2 | 11/2004 | Mascarenhas | |
| 6,951,819 B2 | 10/2005 | Iles et al. | |
| 7,071,407 B2 | 7/2006 | Faterni et al. | |
| 7,119,271 B2 | 10/2006 | King et al. | |
| 7,122,733 B2 | 10/2006 | Narayanan et al. | |
| 7,122,734 B2 | 10/2006 | Fetzer et al. | |
| 7,123,638 B2 | 10/2006 | Leary et al. | |
| 7,126,052 B2 | 10/2006 | Fetzer et al. | |
| 7,255,746 B2 | 8/2007 | Johnson et al. | |
| 7,279,732 B2 | 10/2007 | Meng et al. | |
| 7,709,287 B2 | 5/2010 | Fatemi et al. | |
| 7,727,795 B2 | 6/2010 | Stan et al. | |
| 7,807,921 B2 | 10/2010 | Fetzer et al. | |
| 7,842,881 B2 | 11/2010 | Comfeld et al. | |
| 8,067,687 B2 | 11/2011 | Wanlass | |
| 8,575,473 B2 | 11/2013 | Jones et al. | |
| 2002/0195137 A1 | 12/2002 | King et al. | |
| 2003/0070707 A1 | 4/2003 | King et al. | |
| 2003/0145884 A1* | 8/2003 | King et al. | 136/255 |
| 2004/0045598 A1 | 3/2004 | Narayanan et al. | |
| 2004/0130002 A1 | 7/2004 | Weeks et al. | |
| 2004/0200523 A1 | 10/2004 | King et al. | |
| 2005/0155641 A1 | 7/2005 | Fafard | |
| 2005/0274409 A1 | 12/2005 | Fetzer et al. | |
| 2006/0144435 A1 | 7/2006 | Wanlass | |
| 2006/0162768 A1 | 7/2006 | Wanlass et al. | |
| 2007/0034853 A1 | 2/2007 | Robbins et al. | |
| 2007/0131275 A1 | 6/2007 | Kinsey et al. | |
| 2007/0227588 A1 | 10/2007 | Gossard et al. | |
| 2008/0035939 A1 | 2/2008 | Puetz et al. | |
| 2008/0149173 A1 | 6/2008 | Sharps | |
| 2008/0245400 A1 | 10/2008 | Li | |
| 2008/0257405 A1 | 10/2008 | Sharps | |
| 2009/0001412 A1 | 1/2009 | Nagai et al. | |
| 2009/0014061 A1 | 1/2009 | Harris et al. | |
| 2009/0057721 A1 | 3/2009 | Miura et al. | |
| 2009/0078310 A1 | 3/2009 | Stan et al. | |
| 2009/0145476 A1 | 6/2009 | Fetzer et al. | |
| 2009/0155952 A1 | 6/2009 | Stan et al. | |
| 2009/0229659 A1 | 9/2009 | Wanlass et al. | |
| 2009/0255575 A1 | 10/2009 | Tischler | |
| 2009/0255576 A1 | 10/2009 | Tischler | |
| 2009/0272438 A1 | 11/2009 | Cornfeld | |
| 2009/0288703 A1 | 11/2009 | Stan et al. | |
| 2010/0087028 A1 | 4/2010 | Porthouse et al. | |
| 2010/0096001 A1 | 4/2010 | Sivananthan et al. | |
| 2010/0180936 A1 | 7/2010 | Kim | |
| 2010/0218819 A1 | 9/2010 | Farmer et al. | |
| 2010/0282305 A1 | 11/2010 | Sharps et al. | |
| 2010/0282306 A1 | 11/2010 | Sharps et al. | |
| 2010/0319764 A1 | 12/2010 | Wiemer et al. | |
| 2011/0023958 A1 | 2/2011 | Masson et al. | |
| 2011/0114163 A1 | 5/2011 | Wiemer et al. | |
| 2011/0210313 A1 | 9/2011 | Fujii et al. | |
| 2011/0232730 A1 | 9/2011 | Jones et al. | |
| 2011/0303268 A1 | 12/2011 | Tan et al. | |
| 2012/0031478 A1 | 2/2012 | Boisvert et al. | |
| 2012/0103403 A1 | 5/2012 | Misra et al. | |
| 2012/0211071 A1 | 8/2012 | Newman et al. | |
| 2012/0216858 A1 | 8/2012 | Jones-Albertus et al. | |
| 2012/0216862 A1 | 8/2012 | Abou-Kandil et al. | |
| 2012/0227797 A1 | 9/2012 | Stan et al. | |
| 2013/0118546 A1 | 5/2013 | Jones-Albertus et al. | |
| 2013/0118566 A1 | 5/2013 | Jones-Albertus et al. | |
| 2013/0220409 A1 | 8/2013 | Jones-Albertus et al. | |

FOREIGN PATENT DOCUMENTS

| | | |
|---|---|---|
| JP | 06061516 | 3/1994 |
| JP | 10012905 | 1/1998 |
| WO | 2010/151553 A1 | 12/2010 |
| WO | 2011/062886 A1 | 5/2011 |
| WO | 2011/123164 A1 | 10/2011 |
| WO | 2012/057874 A1 | 5/2012 |
| WO | 2012/115838 A1 | 8/2012 |

OTHER PUBLICATIONS http://sharp-world.com/corporate/news/091022.html "Sharp Develops Solar Cell with Word's Highest Conversion Efficiency of 35.8%", Press Release, dated Oct. 22, 2009, retrieved from the internet on Jul. 9, 2012, 3 pages.

M.A. Green et al., Progress in Photovoltaics: Research and Applications 19 (2011) pp. 565-572.

Bank, et al., "Molecular-beam epitaxy growth of low-threshold cw GaInNAsSb lasers at 1.5 μm," pp. 1337-1340, J. Vac. Sci. Technol. B 23(3), May/Jun. 2005.

Bertness et al., "29.5%-Efficient GaInP/GaAs Tandem Solar Cells," Applied Physics Letters, vol. 65, Aug. 22, 1994, pp. 989-991.

Cotal et al., "III-V multijunction solar cells for concentrating photovoltaics" pp. 174-192, www.rsc.org/ees, Energy and Environmental Science 2, (2009).

Ferguson et al., Nonradiative Recombination in 1.56 μm GaInNAsSb/GaNAs Quantum-Well Lasers, pp. 1-3, published online Dec. 8, 2009, Applied Physics Letters 95, 231104 (2009).

Fewster P.F., "X-Ray Scattering From Semiconductors" Second Edition, Imperial College Press, London, 2003, Ch. 1, pp. 1-22.

Friedman et al., "Analysis of the GaInP/GaAs/1-eV/Ge Cell and Related Structures for Terrestrial Concentration Application," pp. 856-859, Conference Record of the Twenty-ninth IEEE Photovoltaic Specialists Conference, New Orleans, LA., May 19-24, 2002.

Friedman et al., Breakeven Criteria for the GaInNAs Junction in GaInP/GaAs/GaInNAs/Ge Four-junction Solar Cells, pp. 331-344, Progress in Photovoltaics: Research and Applications. (2002).

Friedman et al., "Analysis of Depletion-Region Collection in GaInNAs Solar Cells," pp. 691-694, Conference Record of the Thirty-first IEEE Photovoltaic Specialists Conference, Lake Buena Vista, Florida, Jan. 3-7, 2005.

Garcia et al., Analysis of Tellurium As N-Type Dopant in GaInP: Doping, Diffusion, Memory Effect and Surfactant Properties, pp. 794-799, Journal of Crystal Growth 298 (2007).

Geelen et al., Epitaxial Lift-Off GaAs Solar Cell From a Reusable GaAs Substrate, pp. 162-171, Materials Science and Engineering B45 (1997).

Geisz et al., "Inverted GaInP / (In)GaAs / InGaAs triple-junction solar cells with low-stress metamorphic bottom junctions," Proceedings of the 33rd IEEE PVSC Photovoltaics Specialists Conference, (2008).

Green et al., Progress in Photovoltaics: Research and Applications 20 (2012) pp. 12-20.

Green, "Third Generation Photovoltaics: Advanced Solar Energy Conversion," pp. 95-109, Springer Publishing, Berlin, Germany (2003).

(56) References Cited

OTHER PUBLICATIONS

Green, Do Built-in Fields Improve Solar Cell Performance? pp. 57-66, Progress in Photovoltaics: Research and Applications (2009), Published online in Wiley InterScience (www.interscience.wiley.com) on Oct. 1, 2008.
Gu et al., "Gas Source Growth and Doping Characteristics of AlInP on GaAs" Materials Science and Engineering B 131 (2006), pp. 49-53.
Harris Jr. et al., "Development of GaInNAsSballoys: Growth, band structure, optical properties and applications," 2007, Physics Status Solidi(b), vol. 244, Issue 8, pp. 2707-2729, Jul. 6, 2007.
Hovel H.J., "Semiconductors and Semimetals", Academic Press, New York, 1975, Ch. 2, pp. 8-47.
Jackrel et al., "GaInNAsSb Solar Cells Grown by Molecular Beam Epitaxy," pp. 1-16, IEEE 4th World Conference on Photovoltaic Energy Conversion, Waikoloa, HI, 2006.
Jackrel et al., "GaInNAsSb Solar Cells Grown by Molecular Beam Epitaxy," 2006. Photovoltaic Energy Conversion, Conference Record of the 2006 IEEE 4th World Conference, vol. 1, p. 783-786, May 2006.
Jackrel et al., "Dilute nitride GaInNAs and GaInNAsSb solar cells by molecular beam epitaxy", pp. 1-8, Journal of Applied Physics 101 (114916), Jun. 14, 2007.
Janotti et. al., Mutual Passivation of Electrically Active and Isovalent Impurities in Dilute Nitrides, Physical Review Letters 100, 045505 (2008).
King et al., "High-Voltage, Low-Current GaInP/GaInP/GaAs/GaInNAs/Ge Solar Cells" Spectrolab Inc., 2002, pp. 852-855.
King et al., "40% Efficient Metamorphic GaInP/GaInAs/Ge Multijunction Solar Cells," J. of Applied Physics Letters, May 4, 2007.
Kudrawiec, "Contactless electroreflectance of GaInNAsSb/GaAs single quantum wells with indium content of 8%-32%", Jan. 2007, Journal of Applied Physics, vol. 101, pp. 013504-1-013504-9.
Kurtz et al., "Projected Performance of Three and Four-Junction Devices Using GaAs and GaInP," pp. 875-878, 26th IEEE Photovoltaics Specialists Conference, (1997).
Merrill et al., Directions and Materials Challenges in High Performance Photovoltaics, Dec. 2007, JOM Energetic Thin Films, 59, 12, 26-30.
Miyashita et al., Effect of Indium Composition on GaInNAsSb Solar Cells Grown by Atomic Hydrogen-Assisted Molecular Beam Epitaxy, pp. 000632-000635, 978-1-4244-2950@ 2009 IEEE.
Miyashita et al., "Improvement of GaInNAsSb films fabricated by atomic hydrogen-assisted molecular beam epitaxy", pp. 3249-3251, Journal of Crystal Growth 311, 2009.
Ng et al., 1EV GANXAS1-X-YSBY Material for Lattice-Matched III-V Solar Cell Implementation on GaAs and Ge, pp. 76-80, (2009).
Olson J.M. et al., "High-Efficiency III-V Multijunction Solar Cells" Handbook of Photovoltaic Science and Engineering, 1st ed.; Luque, A., Hegedus, S., Eds.; Wiley: New York, NY, USA, 2003; Chapter 9, pp. 359-411.
Ptak et al., "Effects of Temperature, Nitrogen Ions and Antimony on Wide Depletion Width GaInNAs," pp. 955-959.J. Vac. Sci. Tech. B25(3), May/Jun. 2007 (published May 31, 2007).
Ptak et al., "Low-acceptor-Concentration GaInNAs grown by Molecular-beam Epitaxy for High-current p-i-n solar cell applications." J. of Applied Physics, 98.094501 (2005).
Ptak et al., "Defects in GaInNAs: What We've Learned so Far" National Renewable Energy Laboratory NREL/CP-520-33555, May 2003, 7 pages.
Sabnis et al., A new roadmap for space solar cells, Industry Photovoltaics, www.compoundsemiconductor.net/csc/features-details/19735471, Aug./Sep. 2012, 5 pages.
Volz et al., Optimization of Annealing Conditions of (GaIn)(NAs) for Solar Cell Applications, pp. 2222-2228, Journal of Crystal Growth 310 (2008).
Volz et al., MOVPE growth of dilute nitride III/V semiconductors using all liquid metalorganic precursors, Journal of Crystal Growth 311 (2009), pp. 2418-2526.
Wiemer et al., "43.5% Efficient Lattice Matched Solar Cells" Proc. SPIE 810804 (2011), 5 pages.
Wistey et al., Nitrogen Plasma Optimization for High-Quality Dilute Nitrides, pp. 229-233, Journal of Crystal Growth, available online on Feb. 1, 2005 at http://www.sciencedirect.com.
Wu et al., Band Anticrossing in Highly Mismatched III-V Semiconductor Alloys, pp. 860-869, Semiconductor Science and Technology 17 (2002).
Yamaguchi et al., "Multi-junction III-V solar cells: current status and future potential", in: Solar Energy, vol. 79, issue 1, Jul. 2005.
Yu et. al., Mutual Passivation of Group IV Donors and Nitrogen in Diluted $GaN_xAs_{1-x}$ Alloys, pp. 2844-2846, Applied Physics Letters, vol. 83, No. 14 (Oct. 6, 2003).
International Search Report and Written Opinion PCT/US2008/008495 mailed Apr. 6, 2009, 5 pages.
International Preliminary Report on Patentability PCT/US2008/008495 dated Jan. 12, 2010, 5 pages.
International Search Report and Written Opinion corresponding to the PCT application No. PCT/US10/39534, date of mailing Sep. 8, 2010, 8 pages.
International Search Report and Written Opinion corresponding to the PCT application No. PCT/US10/56800, date of mailing Jan. 26, 2011, 8 pages.
International Search Report and Written Opinion corresponding to the PCT application No. PCT/US2010/061635, date of mailing Mar. 1, 2011, 7 pages.
International Search Report and Written Opinion corresponding to the PCT application No. PCT/US11/36486, date of mailing Aug. 25, 2011, 12 pages.
International Preliminary Report on Patentability for PCT Application No. PCT/US2010/056800, mailed on May 31, 2012, 6 pages.
International Search Report and Written Opinion of the International Searching Authority for PCT Application No. PCT/US12/36020, mailed on Aug. 14, 2012, 11 pages.
Non-Final Office Action of Jun. 10, 2010 for U.S. Appl. No. 12/217,818, 15 pages.
Final Office Action of Jan. 1, 2011 for U.S. Appl. No. 12/217,818, 15 pages.
Non-Final Office Action of Oct. 5, 2012 for U.S. Appl. No. 12/944,439, 15 pages.
Non-Final Office Action of Oct. 24, 2012 for U.S. Appl. No. 12/749,076, 17 pages.
Non-Final Office Action of Nov. 8, 2012 for U.S. Appl. No. 13/104,913, 12 pages.
Non-Final Office Action of Dec. 14, 2012 for U.S. Appl. No. 13/618,496, 16 pages.
Final Office Action of Feb. 6, 2013 for U.S. Appl. No. 13/618,496, 8 pages.
Cornfeld et al., "Evolution of a 2.05 eV AIGaInP Top Sub-cell for 5 and 6J-IMM Applications", Photovoltaic Specialists Conference (PVSC), 38th IEEE, Jun. 3, 2012, p. 2788-2791.
E. Wesoff, "Update: Solar Junction breaking CPV efficiency records, raising $30M", Greentech Media, Apr. 15, 2011, 4 pages.
E. Wesoff, "CPV Roundup: SolFocus funding, 5MW order for Solar Junction, GreenVolts, Amonix", Greentech Media, May 22, 2012, 3 pages.
E. Wesoff, "Record 44 percent CPV efficiency from startup Solar Junction", Greentech Media, Oct. 15, 2012, 3 pages.
Friedman et al., "1-eV Solar cells with GaInNAs active layer", Journal of Crystal Growth, vol. 195, 1998, p. 409-415.
Kurtz et al., "Understanding the potential and limitations of dilute nitride alloys for solar cells", Paper No. NREL/CP-520-38998, DOE Solar Energy Technologies Conference, Denver, CO, Nov. 7-10, 2005, 5 pages.
Patton et al., "Development of a High Efficiency Metamorphic Triple-junction 2.1 eV/1.6 eV/1.2 eV AIGaInP/InGaAsP/InGaAs Space Solar Cell", Conference Record of the IEEE Photovoltaic Specialists Conference, Institute of Electrical and Electronics Engineers Inc., May 19, 2002, vol. 29, p. 1027-1030.
Weyers et al., "Red shift of photoluminescence and absorption in dilute GaAsN alloy layers", Japan Journal of Applied Physics, vol. 31, Issue 7A, 1992, p. L853-L855.

(56) References Cited

OTHER PUBLICATIONS

"IQE's CPV materials successfully qualified for high-volume production by Solar Junction", Semiconductor Today, Aug. 2013, 2 pages.
"Fraunhofer ISE, Solitec, Leti and Helmholz Center achieve record 44.7% solar cell efficiency", Semiconductor Today, Sep. 2013, 2 pages.
"Solar Junction beats its own record with 44.1% efficiency", Compound Semiconductor, Aug. 2013, 1 page.
International Search Report and Written Opinion for PCT Application No. PCT/US2013/033567, mailed on Mar. 4, 2014, 12 pages.
Non-Final Office Action for U.S. Appl. No. 12/819,534, mailed on Feb. 21, 2013, 8 pages.
Non-Final Office Action for U.S. Appl. No. 12/914,710, mailed on Feb. 15, 2013, 14 pages.
Notice of Allowance for U.S. Appl. No. 13/618,496, mailed on Mar. 22, 2013, 8 pages.
Non-Final Office Action for U.S. Appl. No. 13/708,763, mailed on Apr. 15, 2013, 23 pages.
Non-Final Office Action for U.S. Appl. No. 13/708,791, mailed on Apr. 25, 2013, 16 pages.
Non-Final Office Action for U.S. Appl. No. 13/739,989, mailed on May 15, 2013, 7 pages.
Final Office Action for U.S. Appl. No. 12/944,439, mailed on May 29, 2013, 11 pages.
Final Office Action for U.S. Appl. No. 12/914,710, mailed on Sep. 6, 2013, 17 pages.
Final Office Action for U.S. Appl. No. 13/104,913, mailed on Oct. 2, 2013, 12 pages.
Final Office Action for U.S. Appl. No. 13/708,791, mailed on Oct. 1, 2013, 15 pages.
Final Office Action for U.S. Appl. No. 13/739,989, mailed on Feb. 26, 2014, 16 pages.
Notice of Allowance for U.S. Appl. No. 13/104,913, mailed on Feb. 21, 2014, 8 pages.
Non-Final Office Action for U.S. Appl. No. 13/678,389, mailed on Feb. 20, 2014, 13 pages.
Notice of Allowance for U.S. Appl. No. 13/708,763, mailed on Feb. 20, 2014, 9 pages.
Non-Final Office Action for U.S. Appl. No. 13/442,146, mailed on Mar. 21, 2014, 6 pages.
U.S. Appl. No. 12/819,534, Final Office Action mailed on Sep. 9, 2013, 13 pages.
U.S. Appl. No. 12/944,439, Non-Final Office Action mailed on Aug. 13, 2014, 11 pages.
Japanese Application No. 2012-517662, Office Action mailed on Apr. 30, 2013, 5 pages. (English translation).
Japanese Application No. 2013-502560, Office Action mailed on May 7, 2014, 5 pages. (English translation).
Japanese Application No. 2013-536607, Office Action mailed on Mar. 18, 2014, 6 pages. (English translation).
Bhuiyan et al., InGaN Solar Cells: Present State of the Art and Important Challenges, IEEE Journal of Photovoltaics, vol. 2, No. 3, Jul. 2012, pp. 246-293.
Miller et al., GaAs-AlGaAs tunnel junctions for multigap cascade solar cells, Journal of Applied Physics, vol. 53, No. 1, Jan. 1982, pp. 744-748.

* cited by examiner

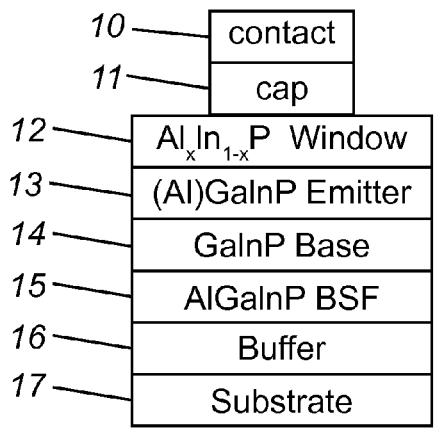
FIG. 1
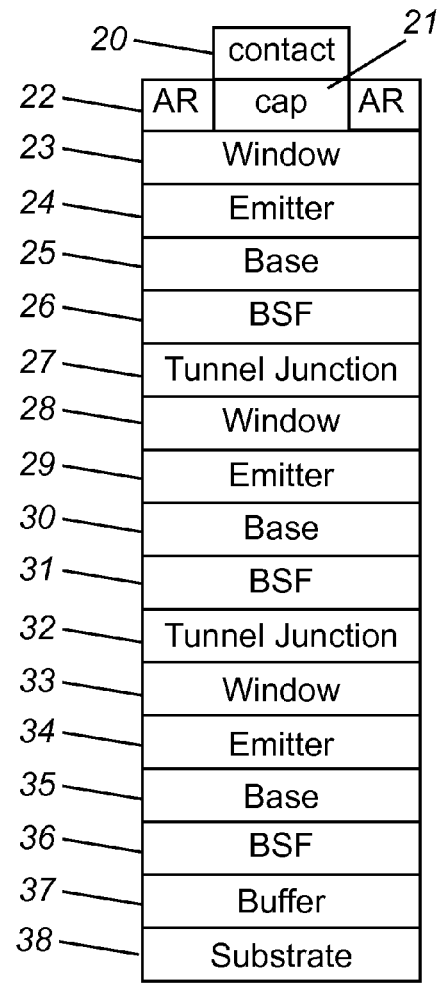
FIG. 2B
FIG. 2A

| Al mole fraction | EQE Jsc (mA/cm²) |
|---|---|
| 70% Al | 10.7 +/- 0.1 |
| 52% Al | 10.3 +/- 0.1 |
| Difference (mA/cm²) | 0.4 |
| Al mole fraction | IQE Jsc (mA/cm²) |
| 70% Al | 14.2 +/- 0.1 |
| 52% Al | 14.0 +/- 0.1 |
| Difference (mA/cm²) | 0.2 |

FIG. 5A1

| Al mole fraction | EQE Jsc (mA/cm²) |
|---|---|
| 70% Al | 13.9 +/- 0.1 |
| 52% Al | 13.4 +/- 0.1 |
| Difference (mA/cm²) | 0.5 |
| Al mole fraction | IQE Jsc (mA/cm²) |
| 70% Al | 14.1 +/- 0.1 |
| 52% Al | 13.6 +/- 0.1 |
| Difference (mA/cm²) | 0.5 |

FIG. 5A2

PSEUDOMORPHIC WINDOW LAYER FOR MULTIJUNCTION SOLAR CELLS

CROSS-REFERENCES TO RELATED APPLICATIONS

The present application claims benefit under 35 USC 119 (e) of U.S. provisional Application No. 61/446,704, filed on Feb. 25, 2011, entitled "PSEUDOMORPHIC WINDOW LAYER FOR MULTIJUNCTION SOLAR CELLS," the content of which is incorporated herein by reference in its entirety.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

1. Field of Invention

The invention generally relates to photovoltaic solar cells and, more particularly, to high-efficiency multijunction photovoltaic solar cells based on III-V semiconductor compounds.

2. Description of Related Art

Multijunction solar cells, based on III-V semiconductor compounds, have demonstrated high efficiencies for the generation of electricity from solar radiation. Such cells have reached 35.8% efficiency under the AMOG spectra (http://www.sharp-world.com/corporate/news/091022.html) and 43.5% (see M. A. Green et al., Progress in Photovoltaics: Research and Applications 19 (2011) 565-572) under concentrated sunlight equivalent to several hundred suns. Such efficiency and power achievements make it possible to apply this technology to the space and terrestrial energy markets. The solar cells with the highest efficiencies to date have employed three subcells having differing energy band gaps and arranged to permit each subcell to absorb a different part of the solar spectrum. Each subcell comprises a functional p-n junction and other layers, such as window and back surface field layers. These subcells are connected through tunnel junctions, with the layers either lattice matched to the underlying substrate or grown over metamorphic buffer layers.

Each subcell typically includes a window, emitter, base and back surface field (BSF) and may or may not include other layers. Those of skill in the art will also recognize that it is possible to construct subcells that do not contain all of the foregoing layers. The window and the BSF reflect minority carriers away from their interfaces with the emitter and base layers, respectively, and are well known to be critical to high efficiency carrier collection. The materials and doping levels used for windows are chosen such that the band alignment produces a large energy barrier for the minority carriers with a minimal barrier for majority carriers. This allows majority carriers to diffuse through the window, while minority carriers are reflected. It is critical that the interface between the window and the emitter be very high quality, to minimize the minority carrier surface recombination velocity. The window also typically has a higher band gap than the adjacent emitter in order to minimize its absorption of incident light.

For the top subcell, the window can be a major source of current loss. The window absorbs a fraction of the incident light in the solar spectrum that is above its band gap, and generates electron-hole pairs, or photocarriers. These photocarriers are not collected with high efficiency due to the high surface recombination velocity for minority carriers at the top of the window, and the low minority carrier diffusion lengths that are common in window materials. In subcells below the top subcell, the band gap of the window need not be as high as in the top subcell, because the top subcell will already have absorbed the higher energy photons. The window layer of lower subcells may be a source of loss if the upper subcell(s) do not absorb all light above the band gap of this window.

The intrinsic material lattice constant is defined as the lattice spacing a material would have as a free-standing crystal. When a semiconductor material has a substantially different intrinsic lattice constant than the substrate or the underlying layers on which is grown, the material will initially adopt the lattice constant of the underlying layers. The semiconductor material is strained, however, and the degree of strain is proportional to the difference in intrinsic material lattice constants between the material and the adjacent material on which it is grown.

As the thickness of such a semiconductor layer is increased, the accumulated strain increases until a critical thickness is reached, after which it becomes energetically favorable to relax and relieve strain through dislocation, i.e., departure of the atoms from their normal crystalline structures. The critical thickness depends upon many factors, including the materials involved, the substrate and/or underlying layers, growth technique and growth conditions. For a difference in intrinsic material lattice constants of about 1%, U.S. Pat. No. 4,935,384 to Wanlass et al. teaches that the critical thickness is around 15 nm. Below that critical thickness, Wanlass reports that the semiconductor layer is considered pseudomorphic, or fully strained, and the semiconductor layer holds the lattice constant of its substrate or underlying layer in the plane perpendicular to the growth direction. Typically, such a layer will have a different lattice constant in the direction of growth, with all lattice constants different from the material's intrinsic material lattice constant. The semiconductor layer is considered fully relaxed when sufficient dislocations have formed that the layer has been essentially restored to its intrinsic material lattice constants. In general, layers may be fully strained, fully relaxed, or partially strained and partially relaxed when grown on top of a substrate or layers with a substantially different lattice constant. This discussion has assumed that the materials have a cubic crystal structure in which the intrinsic material lattice constant is the same in all three crystal directions. An analogous discussion is appropriate for materials which are not cubic.

The prior art is primarily photovoltaic cells with window layers that have nominally the same intrinsic material lattice constants as the cell layers beneath them. For a given alloy system, choosing the lattice constant fixes the material composition and therefore its relevant properties such as its bandgap energy. For example, fully disordered $Al_xIn_{1-x}P$ has substantially the same intrinsic material lattice constant as a GaAs substrate where x=0.52. This composition has an indirect band gap of 2.29 eV and a direct band gap of 2.37 eV at 300K. Strained, pseudomorphic window layers are mentioned by Wanlass et al. and King et al. (U.S. Pat. No. 7,119,271), but, as mentioned above, the teaching is that the critical thickness is 15 nm for a 1% difference in lattice constants. A thickness of 15 nm or less is too thin for practical use in many multijunction solar cells; hence, King et al. focus on window layers that are fully relaxed rather than pseudomorphic.

King et al. use a fully relaxed, high-band-gap window layer that incorporates dislocations to achieve relaxation in photovoltaic cells. While relaxation via dislocations have been claimed to improve interface quality and minimize defect transport, the greater body of work in the literature shows that dislocations are non-radiative recombination centers that degrade the quality of the material and reduce its current collection efficiency. In addition, defects at the interface of the emitter and window can increase the surface recombination velocity of the minority carriers and further degrade the solar cell efficiency. Thus, fully relaxed window layers are not ideal for high efficiency solar cells.

To improve the efficiency of high efficiency solar cells, it is desirable to maximize the band gap of the window layer of the top subcell, which typically reduces the light absorption in the window and increases the current of the solar cell, while avoiding dislocations that would be produced by relaxation.

SUMMARY

According to the invention, a photovoltaic solar cell with one or more subcells is provided, wherein at least one subcell has a wide-band-gap, pseudomorphic window layer of at least 15 nm in thickness and with an intrinsic material lattice constant that differs by at least 1% from an adjacent emitter layer. This window layer has a higher band gap than a window layer with substantially the same intrinsic material lattice constant as the adjacent emitter layer, which increases the light transmission through the window, thereby increasing the current generation in the solar cell. The quality of being a pseudomorphic material preserves a good interface between the window and the emitter, reducing the minority carrier surface recombination velocity, resulting in higher efficiency.

In a method according to the invention, a wide band gap, pseudomorphic (Al)In(Ga)P window layer of a photovoltaic cell is grown that has a lattice constant that differs by at least 1% from the adjacent emitter layer. The method utilizes growth temperatures of 300-550 degrees Celsius with growth rates of at least 0.1 microns per hour to deposit a layer of 15-60 nm of thickness that is fully strained. The elemental and molecular source material used to grow this layer has at least 99.9999% purity. Molecular beam epitaxy is a preferred technique for depositing the window layer, with a background pressure less than $10^{-5}$ Torr. Relaxation, or the formation of dislocations to accommodate the change in lattice constant, is inhibited by the use of this growth method.

BRIEF DESCRIPTION OF THE DRAWINGS

FIG. 1 shows a schematic cross-section of an example of a single junction solar cell according to the invention.

FIG. 2A shows a schematic cross-section of a photovoltaic cell with three subcells, where each subcell comprises a window, emitter, base and back surface field connected by tunnel junctions.

FIG. 2B shows a schematic cross-section of one subcell of a multijunction solar cell, according to the invention.

FIG. 5A1 shows the short-circuit current ($J_{sc}$) calculated using the external and internal quantum efficiency data for the two GaInP solar cells, and the difference in $J_{sc}$ between the two solar cells.

FIG. 5A shows the measured internal quantum efficiency (IQE) of the GaInP subcells of two multijunction solar cells.

FIG. 5A2 shows the short-circuit current ($J_{sc}$) calculated using the external and internal quantum efficiency data for the two GaInP subcells of multijunction solar cells, and the difference between in $J_{sc}$ between the two subcells.

DETAILED DESCRIPTION OF THE INVENTION

Figure 3:
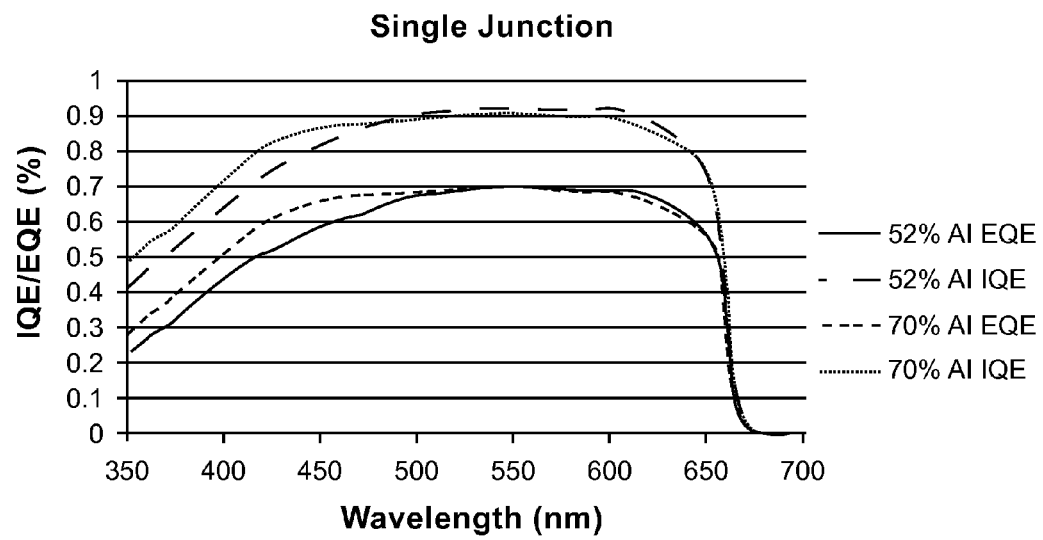
FIG. 3 shows the measured external quantum efficiency (EQE), and internal quantum efficiency (IQE) of two GaInP solar cells with no anti-reflection coating (ARC).

According to the invention, a photovoltaic cell having one or more subcells is provided, wherein at least one of the subcells has a pseudomorphic window layer that has an intrinsic material lattice constant that differs by at least 1% from the adjacent emitter layer of the subcell. The window layer is on the order of between 15-60 nm in thickness. The window layer has a higher band gap than materials or compositions that have substantially the same intrinsic material lattice constant as the adjacent emitter layer. Having an intrinsic material lattice constant that differs by at least 1% from the adjacent emitter layer, rather than a smaller amount, maximizes the increase in band gap in the window layer. Higher band gaps are desirable because they produce a larger increase in solar cell efficiency, by reducing the fraction of the solar spectrum that can be absorbed by the window layer.

As an example, FIG. 1 shows a schematic cross-section of a photovoltaic cell with one subcell, also known as a single junction solar cell, according to the invention. Layers are not drawn to scale. The cell includes a thin window 12 (e.g., $Al_xIn_{1-x}P$), an emitter 13 (e.g., (Al)GaInP), a base 14 (e.g., GaInP) and back surface field 15 (e.g., AlGaInP), in addition to buffer layer(s) 16, a substrate 17 and cap 11 and contact layers 10. The back contact is not shown. The emitter, base and back surface field have substantially the same intrinsic material lattice constant as the substrate. The window layer has an intrinsic material lattice constant that differs from that of the adjacent emitter, as well as the substrate, by at least 1%. This means that subtracting the intrinsic material lattice constant of the window from that of the substrate and dividing this number by the intrinsic material lattice constant of the substrate yields an absolute value of at least 0.01 (or 1%). The window layer is fully strained with no relaxation via dislocations. In one embodiment, the window layer is $Al_xIn_{1-x}P$ (x>0.65) of between 15 and 60 nm in thickness, and the substrate is GaAs or Ge. $Al_xIn_{1-x}P$ with x>0.65 has a wider band gap than the composition of x=0.52 that has substantially the same intrinsic material lattice constant as the substrate, increasing the transmission of light to the emitter and base and increasing the photovoltaic cell efficiency. The current collection efficiencies in the emitter and base are higher than in the window layer, for reasons discussed above. Increasing the transmission of light to the emitter and base, and decreasing absorption in the window, will increase the solar cell's overall current collection and efficiency.

FIG. 2A shows a schematic cross-section of an exemplary photovoltaic cell consisting of three subcells (which may be identified as the top cell, middle cell and bottom cell, where the direction references proximity to the light source above), where each subcell consists of a window 23, 28, 33, emitter 24, 29, 34, base 25, 30, 35, and back surface field (BSF) 26, 31, 36 layer. These subcells are connected by tunnel junctions 27, 32. The substrate 38, buffer layer(s) 37, cap 21, top contact 20 and anti-reflection coating 22 (AR) are also shown. The back contact is not shown. FIG. 2B shows a schematic cross-section of a subcell of a photovoltaic cell corresponding to elements 23, 24, 25 and 26, according to the invention. The pseudomorphic window layer has a thickness of at least 15 nm and an intrinsic material lattice constant that differs by at least 1% from that of the adjacent emitter layer. In a preferred embodiment of the invention, the window layer is comprised of $Al_xIn_{1-x}P$ with x>0.65, where x=0.52 indicates the composition that has substantially the same intrinsic material lattice constant as the $Ga_{0.51}In_{0.49}P$ emitter and base, and the GaAs or Ge substrate. Compared to x=0.52, the transmission of light to the emitter and base is increased with a window of $Al_xIn_{1-x}P$ with x>0.65, which increases the photovoltaic cell efficiency.

In some embodiments, the subcell incorporating the invention will be the top subcell of a photovoltaic cell. In this case, the window may be directly adjacent to the anti-reflection coating, as illustrated by window 23 in FIG. 2A. In this case the window layer may also be considered part of the anti-reflection coating. For the example of an AlInP window, the $Al_xIn_{1-x}P$ refractive index helps to reduce the difference between the low refractive indices of the anti-reflection coating layers and the rest of the semiconductor layers in the solar cell structure, which have high refractive indices.

The invention provides a method for producing a fully-strained $Al_xIn_{1-x-y}Ga_yP$ window layer in a photovoltaic cell, where the $Al_xIn_{1-x-y}Ga_yP$ material has a lattice constant that differs from the lattice constant of the adjacent emitter layer by at least 1%. For example, with a $Ga_{0.5}In_{0.49}P$ emitter, an $Al_xIn_{1-x}P$ window with x>0.65 has an intrinsic material lattice constant that differs from that of the emitter by at least 1%. According to the processing method, growth temperatures are between 300 and 550 degrees Celsius with a growth rate of at least 0.1 microns per hour. The source material for the window consists of elemental aluminum, elemental indium, elemental gallium and molecular phosphorus that are each of at least 99.9999% purity. The background pressure of the reactor is less than $10^{-5}$ Torr. With these nonequilibrium growth conditions, dislocation formation is kinetically limited, so fully strained layers with thicknesses of 15-60 nm may be obtained. In a particular embodiment of the invention, molecular beam epitaxy is used to form the fully strained window layers.

Figure 4:
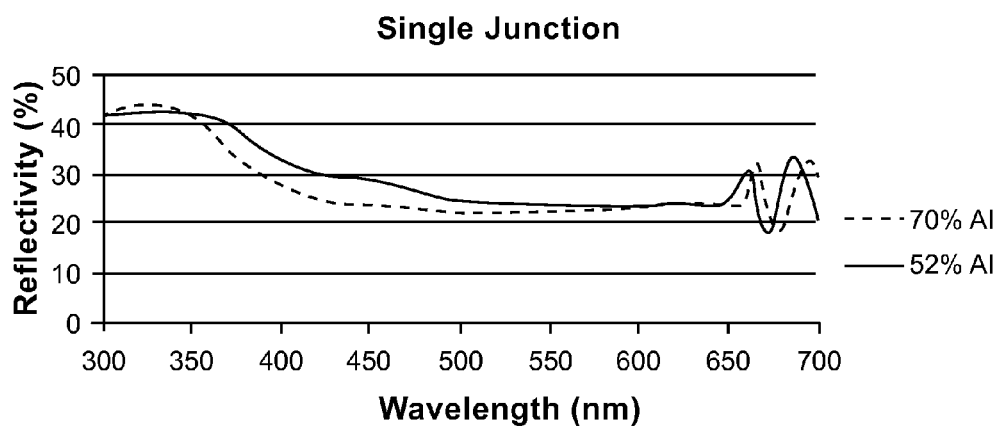
FIG. 4 shows the measured reflectivity of two GaInP solar cell structures with no anti-reflection coating (ARC).

FIG. 3 shows the measured external quantum efficiency (EQE), and internal quantum efficiency (IQE) of two photovoltaic cells with the structure shown in FIG. 1. The cells have no anti-reflection coatings. The EQE is measured using calibrated detectors and it is verified with a standard reference solar cell. The $Al_xIn_{1-x}P$ windows for these structures had thicknesses of approximately 35 nm and had x=0.52 and x=0.70, where $Al_{0.70}In_{0.30}P$ is a fully strained layer according to the invention. The difference in intrinsic material lattice constant between the windows and the GaAs substrate is ~0% (x=0.52) and 1.3% (x=0.70). The IQE is obtained from the EQE using the measured reflectivity shown in FIG. 4 for the two samples, respectively. The EQE response for the sample with x=0.70 is higher than for the sample with x=0.52 for the wavelength range 350 nm to ~450 nm, because the transmission of light through the window is higher. This increase in the EQE translates to an increase in the cell current of 0.4 mA/cm$^2$ under the AM1.5D spectrum. However, the reflectivity for the sample with x=0.70 in the window is lower than the sample with x=0.70 (see FIG. 4). Thus, the improvement in current is lower when it is calculated using the IQE data (0.2 mA/cm$^2$) under the AM1.5D spectrum (FIG. 5A1).

Figure 5A:
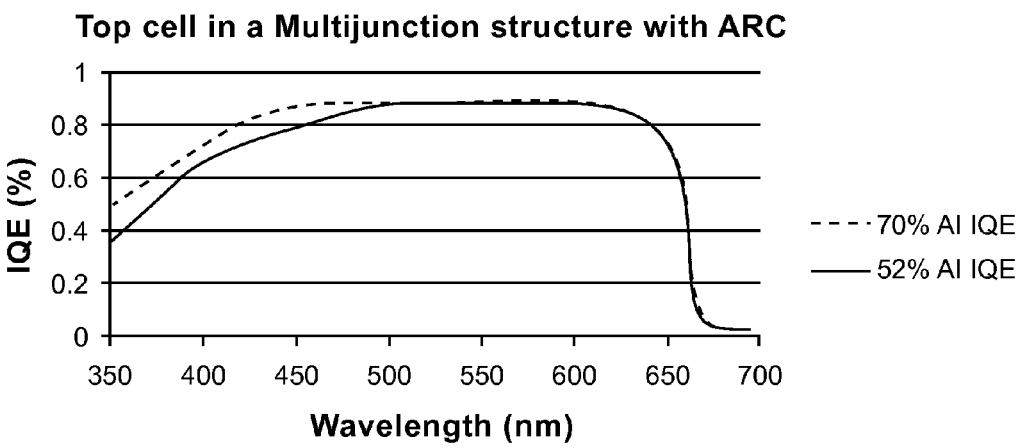
Figure 5B:
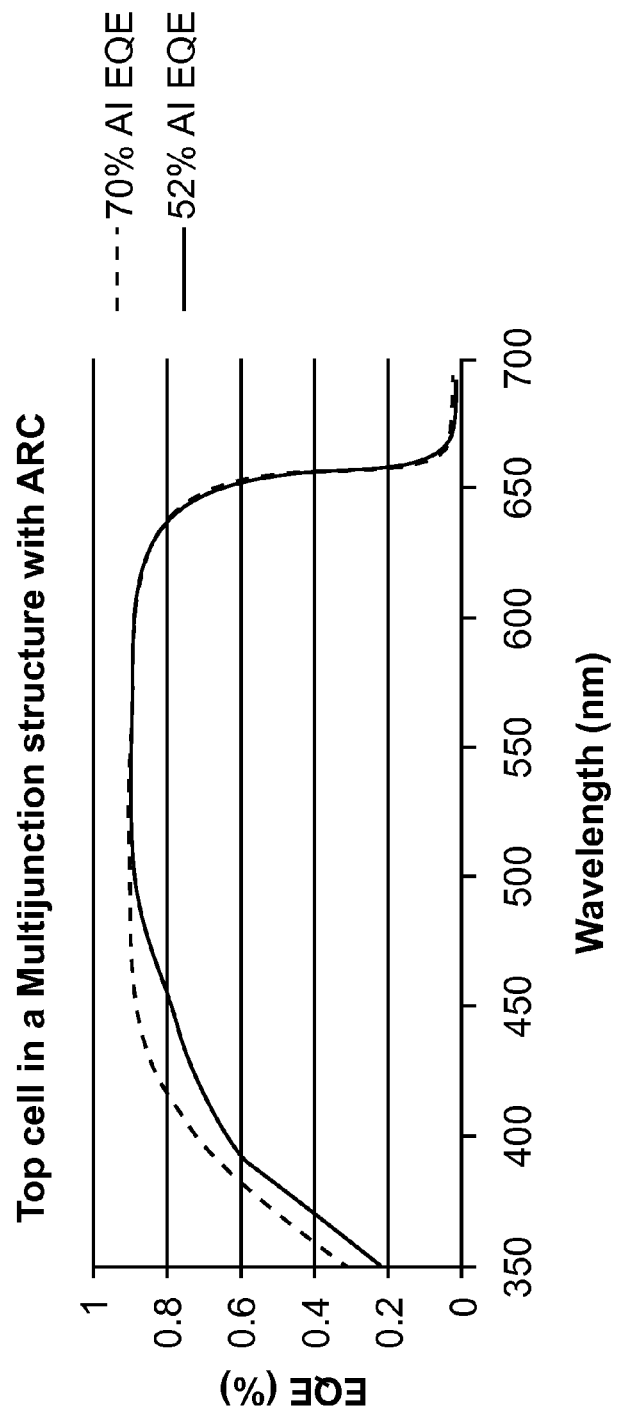
FIG. 5B shows the measured external quantum efficiency (EQE) of the GaInP subcells of two multijunction solar cells.
Figure 6:
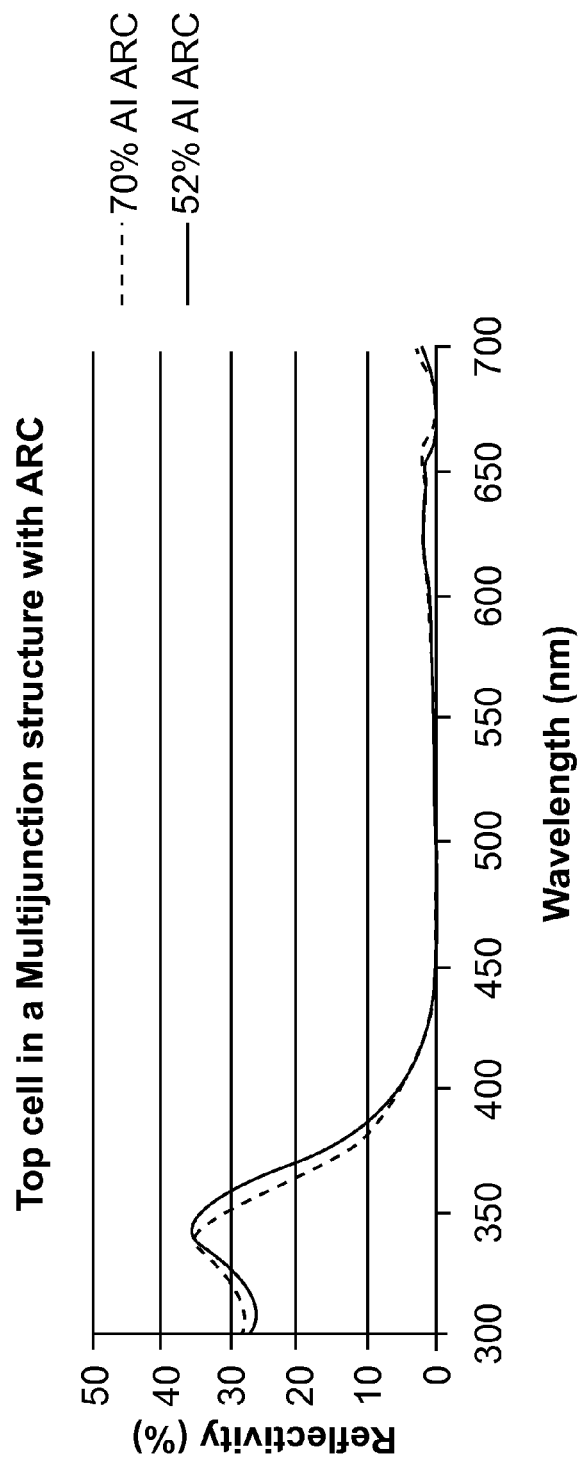
FIG. 6 shows the measured reflectivity of the two multijunction solar cells.

FIG. 5A shows IQE and FIG. 5B shows the measured EQE for GaInP subcells of multijunction photovoltaic cells with anti-reflection coatings (ARC). The structure of the subcells is shown in FIG. 2B, and the GaInP and (Al)InGaP layers have substantially the same intrinsic material lattice constants as the GaAs substrate. The $Al_xIn_{1-x}P$ windows for these structures had thicknesses of approximately 35 nm and had x=0.52 and x=0.70, where $Al_{0.70}In_{0.30}P$ is a fully strained layer according to the invention. The difference in intrinsic material lattice constants between the windows and the adjacent emitter layers is ~0% (x=0.52) and 1.3% (x=0.70). The IQE is obtained from the EQE with the measured reflectivity shown in FIG. 6 for the two samples, respectively. Again, there is an increase in the EQE and IQE for the short wavelength range, and a corresponding increase in the subcell current. The increase in subcell current is 0.5 mA/cm$^2$ under the AM1.5D spectrum, whether the current is determined from IQE or EQE (see FIG. 5A2). For a multijunction solar cell with three subcells, the bottom subcell often has higher current production than the upper and middle subcells, which may be current-matched. Thus, an increase in top subcell current may be split between the top and middle subcells by increasing the top subcell band gap or decreasing the top subcell thickness. Then the 0.5 mA/cm$^2$ gain in current according to this embodiment of the invention would increase the total multijunction cell current by 0.25 mA/cm$^2$.

Figure 7:
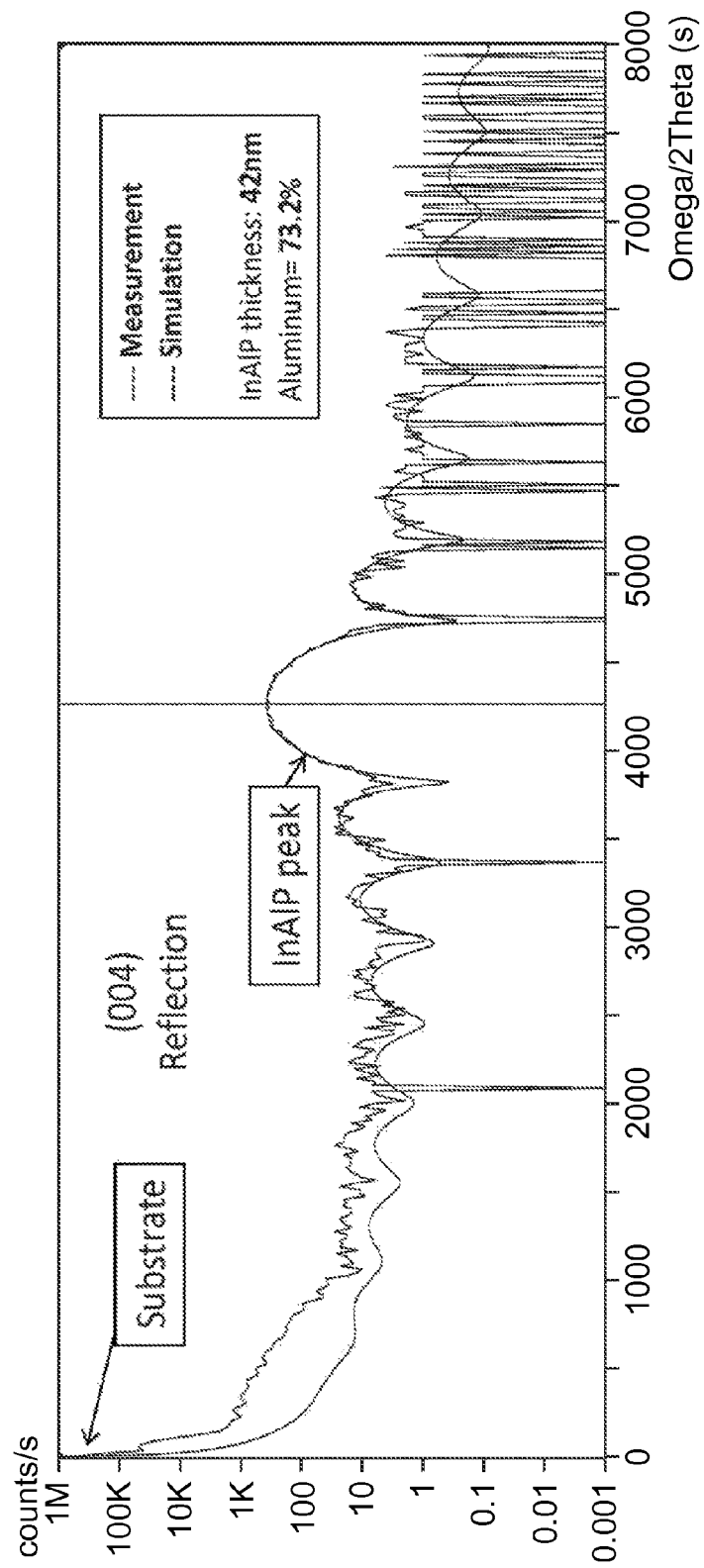
FIG. 7 shows a triple axis x-ray diffraction scan of a triple junction solar cell with a fully strained AlInP window in the top subcell, according to the invention.

Reciprocal space maps and triple-axis rocking curves are well known high resolution, x-ray diffraction techniques for studying strain and relaxation in semiconductor epilayers. When a layer is pseudomorphically grown on a substrate that has a different intrinsic material lattice constant, the adoption of the layer's lattice to that of the substrate causes a tetragonal distortion in the film's unit cells. A Bragg reflection of the epitaxial film—substrate system will split into two reflection peaks, one due to the layer and one to the substrate. This is clearly seen in FIG. 7, which shows a triple-axis x-ray diffraction scan of a multijunction solar cell with the top subcell having a fully strained AlInP window layer according to the invention. The $Ga_{0.51}In_{0.49}P$ emitter that is adjacent to the AlInP window layer has substantially the same intrinsic material lattice constant as the GaAs substrate. The scan, taken in the (004) direction, shows the substrate peak at 0 arc sec and the $Al_{0.73}In_{0.27}P$ layer peak near 4300 arc sec. The $Al_{0.73}In_{0.27}P$ composition and thickness (42 nm) are determined for the fully strained layer from fitting the triple-axis x-ray diffraction scan using known lattice constants for GaAs and the AlInP alloy system. The difference in intrinsic material lattice constant between the AlInP film and the GaAs substrate is 1.5%.

In order to derive the degree of relaxation as well as the AlInP composition, more structural information is needed than is obtained from the measurement of a single triple-axis rocking curve. This is where a reciprocal space map is useful. Reciprocal space mapping is performed such that the Bragg reflection under investigation is fully mapped in a confined area in Q space. Reciprocal space maps may be obtained by joining together successive one-dimensional scans in Q space. A fully strained layer with a different intrinsic material lattice constant will have reciprocal lattice points along the vertical line that passes through the substrate. A fully relaxed layer will have reciprocal lattice points along a line connecting the substrate and the origin of the reciprocal space. For a fully relaxed epilayer on a substrate, the Qx for the epilayer will be different than that of the substrate.

Figure 8:
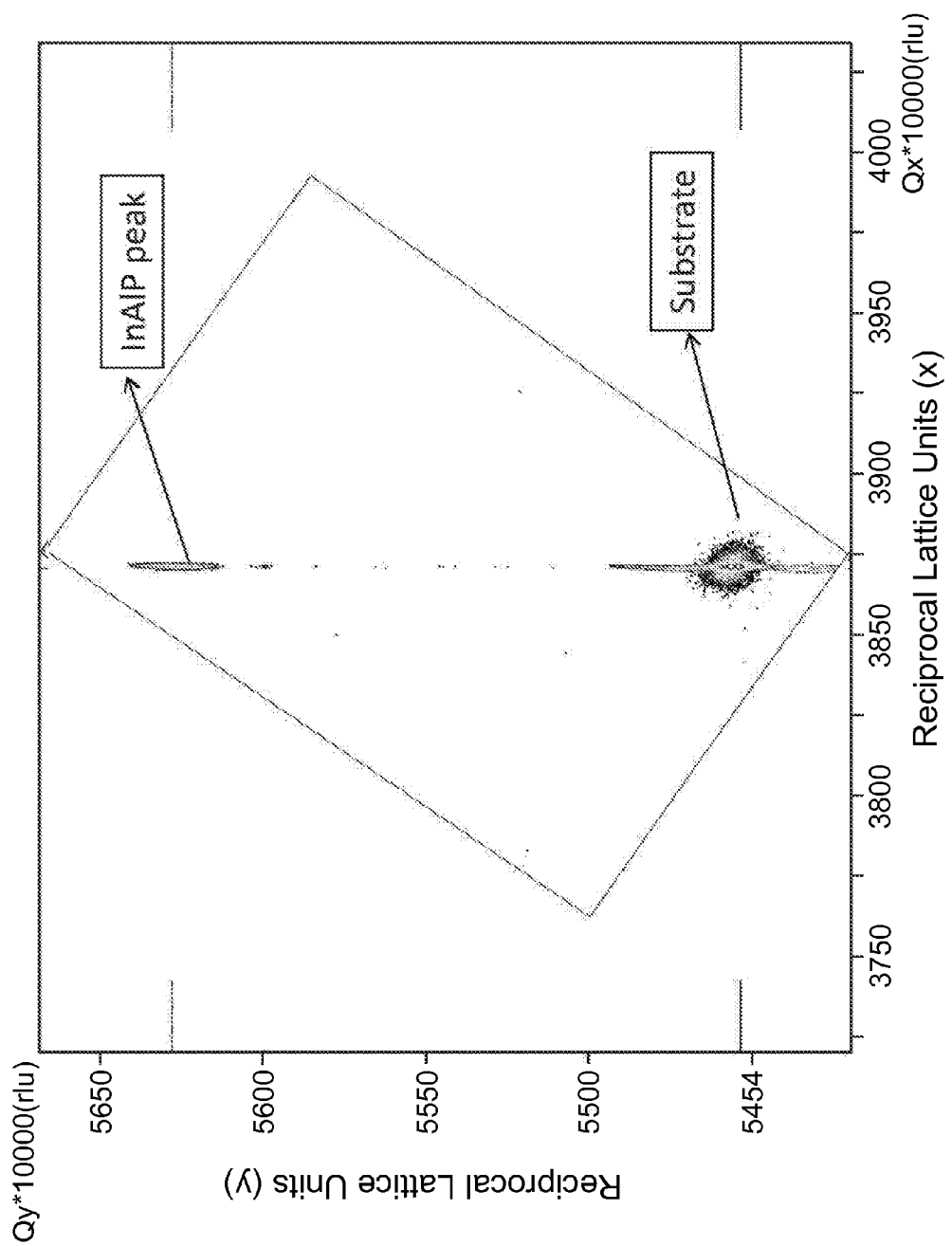
FIG. 8 shows a reciprocal space map along the asymmetric direction (224) of a triple junction solar cell on a GaAs substrate with one subcell having a fully-strained $Al_{0.73}In_{0.27}P$ window according to the invention.
Figure 9:
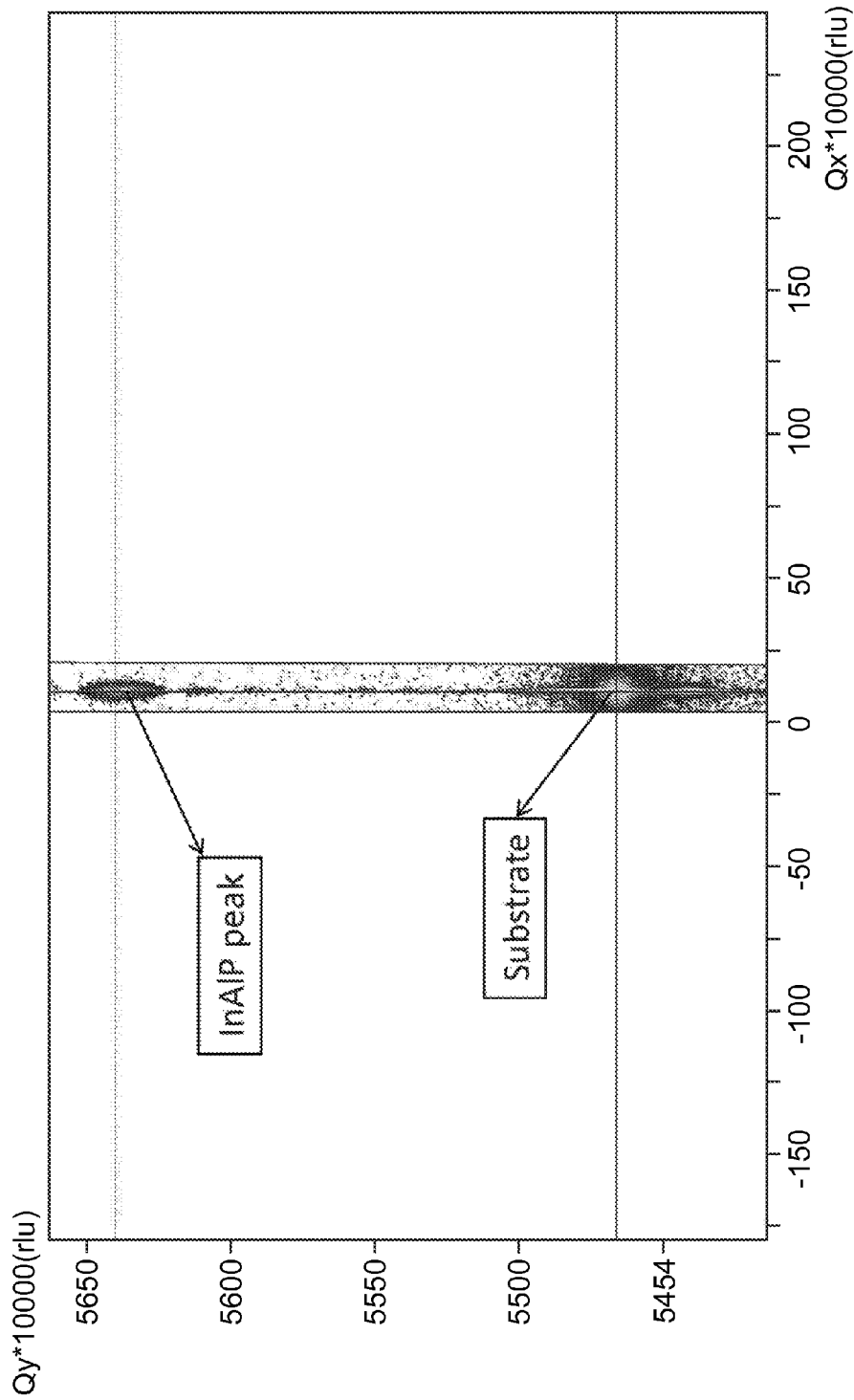
FIG. 9 shows a reciprocal space map along the symmetric direction (004) of a triple junction solar cell on a GaAs substrate with one subcell having a fully-strained $Al_{0.73}In_{0.27}P$ window according to the invention.

FIGS. 8 and 9 show reciprocal space maps done along two orientations of the multijunction solar cell with the top subcell having a $Al_{0.73}In_{0.27}P$ window with a thickness of 42 nm according to the invention, with an intrinsic material lattice constant that differs from the substrate and adjacent emitter by 1.5%. The maps show that the $Al_{0.73}In_{0.27}P$ window is pseudomorphic (i.e., fully strained). FIG. 8 shows the reciprocal space map along the (224) direction, which is the asymmetric scan. FIG. 9 is a representation along the (004) direction, which is the symmetric scan. For the space map along the (224) direction, the $Q_x$ for the substrate and the AlInP layer is the same, and the reciprocal lattice point of the AlInP layer lies along the vertical line normal to the surface. This means that the layer is fully strained and has the same in-plane lattice parameter as the substrate. In the case of symmetric scan, there is nonzero component of the scattering vector along the substrate normal. This means that the symmetric θ-2θ scan is along the y-axis in the reciprocal space while the rocking curve theta scan is along the x-axis in the reciprocal space. A θ-2θ originating from a set of planes which are not parallel to the substrate normal will be in the x-y plane. Thus, there is no indication of relaxation or tilt in the layer viewed with respect to the substrate.

The invention has been explained with reference to specific embodiments. Other embodiments will be evident to those of ordinary skill in the art. It is therefore not intended for the invention to be limited, except as indicated by the appended claims.

What is claimed is:

1. A photovoltaic cell comprising:
at least one subcell having an emitter layer that includes a first material having a first intrinsic material lattice constant, said at least one subcell further having a window layer disposed adjacent to said emitter layer and including a second material having a second intrinsic material lattice constant differing by more than 1% from said first intrinsic material lattice constant;
wherein said window layer is substantially fully strained pseudomorphic layer of more than 15 nm to equal to or less than 60 nm in thickness that has established an internal lattice constant that corresponds to the first intrinsic material lattice constant for substantially its entire layer in a plane perpendicular to the direction of epitaxial growth.

2. The photovoltaic cell of claim 1, wherein the second intrinsic material lattice constant is greater than the first intrinsic material lattice constant.

3. The photovoltaic cell of claim 1, wherein the second intrinsic material lattice constant is less than the first intrinsic material lattice constant.

4. The photovoltaic cell of claim 3, wherein the second material is selected from the group consisting of AlP, AlInP, InGaP, AlInGaP and GaP.

5. The photovoltaic cell of claim 1, wherein the photovoltaic cell is grown on a substrate comprising one of GaAs and Ge.

6. The photovoltaic cell of claim 1, wherein the photovoltaic cell comprises three or more distinct subcells, each subcell with a base layer having a different bandgap.

7. The photovoltaic cell of claim 1, wherein the first material is one of GaAs, InGaP and AlInGaP.

8. The photovoltaic cell of claim 1, wherein the first material comprises GaInP.

9. The photovoltaic cell of claim 1, wherein the second material comprises $Al_xIn_{1-x}P$.

10. The photovoltaic cell of claim 9, wherein x>0.65.

11. The photovoltaic cell of claim 1, wherein the lattice mismatch is at least 1.3%.

12. The photovoltaic cell of claim 1, wherein the lattice mismatch is at least 1.5%.

13. The photovoltaic cell of claim 1, wherein the thickness is at least 35 nm.

14. The photovoltaic cell of claim 1, wherein the thickness is at least 42 nm.

15. The photovoltaic cell of claim 1, wherein,
the lattice mismatch is at least 1.3%; and
the thickness is at least 35 nm.

16. The photovoltaic cell of claim 15, wherein the second material comprises $Al_xIn_{1-x}P$, wherein x>0.65.

17. The photovoltaic cell of claim 1, wherein the window layer is characterized by a higher band gap than a window layer with substantially the same intrinsic material lattice constant as the adjacent emitter layer.

18. A method for forming a fully strained window layer that is adjacent to an emitter in a subcell of a photovoltaic cell comprising:
growing the window layer using molecular beam epitaxy at a temperature between 300 degrees Celsius and 550 degrees Celsius and at a growth rate of at least 0.1 microns per hour;
using source materials comprising primarily elemental aluminum, elemental indium, elemental gallium and molecular phosphorus of at least 99.9999% purity;
using background pressures of less than $10^{-5}$ Torr; and wherein,
the emitter comprises a first material having a first intrinsic material lattice constant;
the window layer comprises a second material having a second intrinsic material lattice constant differing by more than 1% from the first intrinsic material lattice constant;
the window layer is a substantially fully strained pseudomorphic layer of more than 15 nm to equal to or less than 60 nm in thickness that has established an internal lattice constant that corresponds to the first intrinsic material lattice constant for substantially its entire layer in a plane perpendicular to the direction of epitaxial growth; and
the window layer is selected from the group consisting of AlInP, AlInGaP and GaInP.

19. The method of claim 18, wherein the emitter is selected from the group consisting of GaInP, AlInGaP and GaAs.

20. The method of claim 19, wherein the window is formed of $Al_xIn_{1-x}P$ with x>0.65.

* * * * *